(12) United States Patent
Shankar et al.

(10) Patent No.: US 11,094,542 B2
(45) Date of Patent: Aug. 17, 2021

(54) SELECTIVE DEPOSITION OF ETCH-STOP LAYER FOR ENHANCED PATTERNING

(71) Applicant: Lam Research Corporation, Fremont, CA (US)

(72) Inventors: Nagraj Shankar, Tualatin, OR (US); Kapu Sirish Reddy, Portland, OR (US); Jon Henri, West Linn, OR (US); Pengyi Zhang, Tigard, OR (US); Elham Mohimi, Hillsboro, OR (US); Bhavin Jariwala, Lake Oswego, OR (US); Arpan Pravin Mahorowala, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 30 days.

(21) Appl. No.: 16/744,022

(22) Filed: Jan. 15, 2020

(65) Prior Publication Data

US 2020/0168466 A1 May 28, 2020

Related U.S. Application Data

(63) Continuation of application No. 15/972,918, filed on May 7, 2018, now Pat. No. 10,566,194.

(51) Int. Cl.
*H01L 21/033* (2006.01)
*H01L 21/311* (2006.01)
(Continued)

(52) U.S. Cl.
CPC ........ *H01L 21/0337* (2013.01); *C23C 16/401* (2013.01); *C23C 16/403* (2013.01);
(Continued)

(58) Field of Classification Search
CPC ............. H01L 21/0337; H01L 21/0332; H01L 21/0338
See application file for complete search history.

(56) References Cited

U.S. PATENT DOCUMENTS

| | | | |
|---|---|---|---|
| 5,516,625 | A | 5/1996 | Mcnamara et al. |
| 5,879,866 | A | 3/1999 | Starikov et al. |

(Continued)

FOREIGN PATENT DOCUMENTS

| | | |
|---|---|---|
| CN | 112106184 | 12/2020 |
| WO | WO-2014209396 A1 | 12/2014 |
| WO | WO-2019217322 A1 | 11/2019 |

OTHER PUBLICATIONS

U.S. Appl. No. 15/972,918, Notice of Allowance dated Oct. 10, 2019, 15 pgs.
(Continued)

*Primary Examiner* — Sophia T Nguyen
(74) *Attorney, Agent, or Firm* — Schwegman Lundberg & Woessner, P.A.

(57) ABSTRACT

Methods, systems, and computer programs are presented for selective deposition of etch-stop layers for enhanced patterning during semiconductor manufacturing. One method includes an operation for adding a photo-resist material (M2) on top of a base material (M1) of a substrate, M2 defining a pattern for etching M1 in areas where M2 is not present above M1. The method further includes operations for conformally capping the substrate with an oxide material (M3) after adding M2, and for gap filling the substrate with filling material M4 after the conformally capping. Further, a stop-etch material (M5) is selectively grown on exposed surfaces of M3 and not on surfaces of M4 after the gap filling. Additionally, the method includes operations for removing M4 from the substrate after selectively growing M5, and for etching the substrate after removing M4 to
(Continued)

transfer the pattern into M1. M5 adds etching protection to enable deeper etching into M1.

20 Claims, 11 Drawing Sheets

(51) Int. Cl.
| | |
|---|---|
| H01L 21/306 | (2006.01) |
| H01L 21/3105 | (2006.01) |
| H01L 21/67 | (2006.01) |
| H01L 21/02 | (2006.01) |
| C23C 16/455 | (2006.01) |
| C23C 16/40 | (2006.01) |
| H01L 21/027 | (2006.01) |
| H01L 21/308 | (2006.01) |
| C23F 1/08 | (2006.01) |

(52) U.S. Cl.
CPC .. *C23C 16/45536* (2013.01); *C23C 16/45544* (2013.01); *H01L 21/0228* (2013.01); *H01L 21/0273* (2013.01); *H01L 21/02115* (2013.01); *H01L 21/02164* (2013.01); *H01L 21/02178* (2013.01); *H01L 21/02274* (2013.01); *H01L 21/0332* (2013.01); *H01L 21/0338* (2013.01); *H01L 21/3081* (2013.01); *H01L 21/3086* (2013.01); *H01L 21/3088* (2013.01); *H01L 21/30604* (2013.01); *H01L 21/31058* (2013.01); *H01L 21/31122* (2013.01); *H01L 21/31144* (2013.01); *C23F 1/08* (2013.01); *H01L 21/67069* (2013.01)

(56) References Cited

U.S. PATENT DOCUMENTS

| | | | |
|---|---|---|---|
| 5,895,740 | A | 4/1999 | Chien et al. |
| 5,930,627 | A | 7/1999 | Zhou et al. |
| 5,935,873 | A | 8/1999 | Spuler et al. |
| 6,069,046 | A | 5/2000 | Gardner et al. |
| 6,100,014 | A | 8/2000 | Lin et al. |
| 6,291,355 | B1 | 9/2001 | Liu et al. |
| 6,323,528 | B1 | 11/2001 | Yamazaki et al. |
| 6,475,811 | B1 | 11/2002 | Babcock |
| 6,750,150 | B2 | 6/2004 | Chung et al. |
| 6,864,184 | B1 | 3/2005 | Gabriel |
| 7,271,108 | B2 | 9/2007 | Sadjadi |
| 7,309,646 | B1 | 12/2007 | Heo et al. |
| 7,539,969 | B2 | 5/2009 | Sadjadi et al. |
| 8,796,155 | B2 | 8/2014 | Sills et al. |
| 8,889,500 | B1* | 11/2014 | Kamineni ......... H01L 29/66545 438/176 |
| 9,142,474 | B2* | 9/2015 | Chen .................... H01L 29/785 |
| 9,165,765 | B1 | 10/2015 | Raley et al. |
| 9,378,963 | B2 | 6/2016 | Yeh |
| 10,074,559 | B1* | 9/2018 | Bajaj ................. H01L 21/76831 |
| 10,151,981 | B2 | 12/2018 | Devilliers |
| 10,340,135 | B2 | 7/2019 | Blanquart |
| 10,566,194 | B2* | 2/2020 | Shankar ............ H01L 21/02189 |
| 2002/0081852 | A1 | 6/2002 | Sandhu |
| 2002/0142610 | A1 | 10/2002 | Chien et al. |
| 2003/0232509 | A1 | 12/2003 | Chung et al. |
| 2005/0167394 | A1 | 8/2005 | Liu et al. |
| 2006/0063384 | A1 | 3/2006 | Hah et al. |
| 2006/0099783 | A1 | 5/2006 | Gluschenkov et al. |
| 2007/0026654 | A1 | 2/2007 | Huotari et al. |
| 2007/0034971 | A1 | 2/2007 | Anderson et al. |
| 2007/0218677 | A1 | 9/2007 | Engelhardt et al. |
| 2008/0113511 | A1 | 5/2008 | Park et al. |
| 2008/0299465 | A1 | 12/2008 | Bencher et al. |
| 2009/0163035 | A1 | 6/2009 | Romano et al. |
| 2009/0191711 | A1 | 7/2009 | Rui et al. |
| 2009/0209097 | A1 | 8/2009 | Schulz et al. |
| 2009/0291275 | A1 | 11/2009 | Tong et al. |
| 2009/0323411 | A1 | 12/2009 | Bach |
| 2010/0068656 | A1 | 3/2010 | Yeh et al. |
| 2010/0068885 | A1 | 3/2010 | Cirigliano et al. |
| 2010/0258913 | A1 | 10/2010 | Lue |
| 2011/0065049 | A1 | 3/2011 | Kushibiki et al. |
| 2011/0266685 | A1 | 11/2011 | Chumakov et al. |
| 2012/0282780 | A9 | 11/2012 | Romano et al. |
| 2013/0122707 | A1 | 5/2013 | Shimizu et al. |
| 2013/0288471 | A1 | 10/2013 | Chi |
| 2013/0344699 | A1 | 12/2013 | Chiba |
| 2014/0357083 | A1 | 12/2014 | Ling et al. |
| 2015/0024597 | A1* | 1/2015 | Gao ..................... H01L 21/3086 438/694 |
| 2015/0037979 | A1 | 2/2015 | Hudson |
| 2015/0060959 | A1 | 3/2015 | Lin et al. |
| 2015/0255543 | A1 | 9/2015 | Cheng et al. |
| 2015/0279685 | A1 | 10/2015 | Ting et al. |
| 2015/0340469 | A1 | 11/2015 | Chen et al. |
| 2015/0380303 | A1 | 12/2015 | Yang et al. |
| 2016/0033869 | A1 | 2/2016 | Hustad et al. |
| 2016/0254153 | A1* | 9/2016 | Park .................. H01L 21/76843 438/695 |
| 2016/0254171 | A1 | 9/2016 | Shamma et al. |
| 2016/0293417 | A1 | 10/2016 | Park et al. |
| 2016/0307772 | A1 | 10/2016 | Choi et al. |
| 2017/0069530 | A1 | 3/2017 | Lu et al. |
| 2017/0140930 | A1* | 5/2017 | Kao .................. H01L 21/02123 |
| 2017/0178899 | A1 | 6/2017 | Kabansky et al. |
| 2017/0186614 | A1 | 6/2017 | Ko et al. |
| 2017/0256402 | A1* | 9/2017 | Kaufman-Osborn ....................... H01L 21/3105 |
| 2018/0047583 | A1* | 2/2018 | Hautala ............ H01L 21/02362 |
| 2018/0061628 | A1 | 3/2018 | Ou et al. |
| 2018/0061650 | A1 | 3/2018 | Mahorowala et al. |
| 2018/0151346 | A1 | 5/2018 | Blanquart |
| 2018/0226259 | A1 | 8/2018 | Choi et al. |
| 2018/0233536 | A1 | 8/2018 | Chang |
| 2018/0337044 | A1 | 11/2018 | Wang et al. |
| 2018/0337046 | A1 | 11/2018 | Shamma et al. |
| 2019/0140173 | A1 | 5/2019 | Huang et al. |
| 2019/0157094 | A1* | 5/2019 | Lin .................. H01L 21/31111 |
| 2019/0157095 | A1 | 5/2019 | Zhou et al. |
| 2019/0164758 | A1 | 5/2019 | Su et al. |
| 2019/0206681 | A1 | 7/2019 | De Silva et al. |
| 2019/0326114 | A1* | 10/2019 | Kachian ............ H01L 21/02532 |
| 2019/0341256 | A1 | 11/2019 | Shankar et al. |
| 2020/0066521 | A1* | 2/2020 | Lin .................. H01L 21/02282 |
| 2021/0083112 | A1* | 3/2021 | Wu .................. H01L 21/02271 |
| 2021/0098258 | A1* | 4/2021 | Degai ..................... C23C 16/52 |

OTHER PUBLICATIONS

U.S. Appl. No. 15/972,918, Notice of Non-Compliant Amendment mailed Sep. 13, 2019, 2 pgs.
U.S. Appl. No. 15/972,918, Response filed Sep. 23, 2019 to Non-Compliant Amendment mailed Sep. 13, 2019, 6 pgs.
U.S. Appl. No. 15/972,918, Response filed Sep. 6, 2019 to Restriction Requirement dated Aug. 13, 2019, 5 pgs.
U.S. Appl. No. 15/972,918, Restriction Requirement dated Aug. 13, 2019, 6 pgs.
International Application Serial No. PCT/US2019/030929, International Search Report dated Aug. 29, 2019, 3 pgs.
International Application Serial No. PCT/US2019/030929, Written Opinion dated Aug. 29, 2019, 4 pgs.
"International Application Serial No. PCT/US2019/030929, International Preliminary Report on Patentability dated Nov. 19, 2020", 6 pgs.

* cited by examiner

SELECTIVE DEPOSITION OF ETCH-STOP LAYER FOR ENHANCED PATTERNING

CLAIM OF PRIORITY

This application is a Continuation application under 35 USC § 120 of U.S. patent application Ser. No. 15/972,918, entitled "Selective Deposition of Etch-Stop Layer for Enhanced Patterning," filed on May 7, 2018, and is herein incorporated by reference in its entirety.

TECHNICAL FIELD

The subject matter disclosed herein generally relates to methods, systems, and programs for semiconductor etching in a semiconductor manufacturing apparatus. In some examples, deposition control and semiconductor etching is provided during operation of the semiconductor manufacturing apparatus.

BACKGROUND

Semiconductor manufacturing has seen a reduction in critical dimension (CD) and an exponential increase in the cost of multiple patterning. The semiconductor manufacturing industry is transitioning to extreme ultraviolet lithography (EUV) patterning to enable smaller CD features obtained with fewer processing steps. In many cases, the EUV photo resist (PR) material is patterned onto a silicon-based material with an aspect ratio of about 2:1.

During the EUV process, an undesired effect may occur when non-uniformities lead to aspect ratio variation across the wafer. Another problem may arise during semiconductor manufacturing with EUV when the pattern transfer to the under layers is limited to the ability of the EUV PRs to withstand the etch processes defining the pattern. As a result, the EUV PR is quickly consumed and cannot be effectively used to define deep patterns within the under layer.

Another problem is that very thick EUV PRs are required to successfully transfer the pattern successfully to the under layer, but this may lead to line bending (e.g., collapse of the EUV PR lines) or poor selectivity (loss of CD) as the EUV may not penetrate all the way to the bottom of the line.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Example methods, systems, and computer programs are directed to selective deposition of etch-stop layers for enhanced patterning during semiconductor manufacturing. In some implementations, the semiconductor manufacturing process includes extreme ultraviolet lithography (EUV) photo resist (PR) material, but the same principles may be utilized with other patterning techniques. Examples merely typify possible variations.

In some implementations, an etch stop layer, in the form of metal oxides (e.g., zirconium oxide $ZrO_x$, aluminum oxide $AlO_x$, hafnium oxide $HfO_x$) is deposited on a EUV PR pattern to protect the pattern during etch steps. Further, other examples of hardmasks that can be deposited selectively on $SiO_2$, with regard to a $CH_x$ surface of carbon-based gapfill material, include aluminum nitrides AlN, aluminum oxynitride AlON, yttrium oxide Y2O3, yttrium nitride $YN_x$, and yttrium oxynitrides YOxNy. The etch stop layer enables the transferring of the pattern much deeper into the under layer without sacrificing the critical dimension (CD) or causing additional concerns with line bending seen, for example, when using slender PR lines.

In one implementation, a method is provided. The method includes an operation for adding a photo-resist material (M2) on top of a base material (M1) of a substrate, with M2 defining a pattern for etching M1 in areas where M2 is not present above M1. The method further includes operations for conformally capping the substrate with an oxide material (M3) after adding M2, and for gap filling the substrate with filling material M4 after the conformal capping operation. Further, a stop-etch material (M5) is selectively grown on exposed surfaces of M3 and not on surfaces of M4 after the gap filling. Additionally, the method includes operations for removing M4 from the substrate after selectively growing M5, and for etching the substrate after removing M4 to transfer the pattern into M1. M5 adds etching protection to enable deeper etching into M1.

In one example, etching the substrate after removing M4 further comprises etching exposed surfaces of M3 in the substrate, and continuing etching the substrate to transfer the pattern into M1.

In one example, M2 is a carbon-based material.

In one example, M3 is one of silicon dioxide or aluminum oxide.

In one example, M4 is a carbon-based material sacrificial material.

In one example, M5 is a metal oxide.

In one example, conformally capping the substrate with M3 further comprises performing a low-damage plasma enhanced atomic layer deposition.

In one example, gap filling the substrate with filling material M4 further comprises alternating depositing M4 and etching M4 to fill gaps in the substrate.

In one example, selectively growing M5 further comprises utilizing an atomic-layer-deposition process to deposit M5.

In one example, removing M4 from the substrate further comprises performing plasma ashing to remove M4.

In another implementation, a semiconductor manufacturing apparatus comprises a processing chamber and a controller for controlling processing of a substrate within the processing chamber. The controller causes the processing chamber to perform operations comprising: adding a photo-resist material (M2) on top of a base material (M1) of a substrate, with M2 defining a pattern for etching M1 in areas where M2 is not present above M1; conformally capping the substrate with an oxide material (M3) after adding M2; gap filling the substrate with filling material M4 after the conformal capping operation; selectively growing stop-etch material (M5) on exposed surfaces of M3 and not on surfaces of M4 after the gap filling; removing M4 from the substrate after selectively growing M5; and etching the substrate after removing M4 to transfer the pattern into M1, wherein M5 adds etching protection to enable deeper etching into M1 than when utilizing M2 without M5.

In one example, etching the substrate after removing M4 further comprises etching exposed surfaces of M3 in the substrate, and continuing etching the substrate to transfer the pattern into M1.

In one example, M2 is a carbon-based material.

In one example, M3 is one of silicon dioxide or aluminum oxide.

In one example, M4 is carbon.

In one example, M5 is a metal oxide.

In one example, conformally capping the substrate with M3 further comprises performing a low-damage plasma enhanced atomic layer deposition.

In one example, gap filling the substrate with filling material M4 further comprises alternating depositing M4 and etching M4 to fill gaps in the substrate.

In one example, selectively growing M5 further comprises utilizing an atomic-layer-deposition process to deposit M5.

In one example, removing M4 from the substrate further comprises performing plasma ashing to remove M4.

BRIEF DESCRIPTION OF THE DRAWINGS

Various ones of the appended drawings merely illustrate example embodiments of the present disclosure and cannot be considered as limiting its scope.

DETAILED DESCRIPTION

In some examples, selective deposition of etch-stop layers for enhanced patterning during semiconductor manufacturing is presented. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

The presented embodiments can provide several benefits. First, there is the ability to extend the pattern deeper into the under layer when using the etch-stop layer, while using the same EUV PR thickness as in previous implementations. This means that no additional changes are needed for existing EUV processes. Second, a combination of process steps (including adding conformal silicon oxide ($SiO_x$) and gap filling the uneven surfaces on the substrate surface) are used to enable selective growth of the etch-stop layer onto the EUV PR.

Third, there is no (or very minimal) line bending or CD loss when extending the pattern deeper into the under layer. Fourth, the presented implementations may be applied to any structure substrates that need selective growth of etch-stop layers on etched lines as compared to the open space areas for enhanced patterning. These are just some of the benefits that may be obtained using the described methods. Other benefits are possible.

Figure 1:
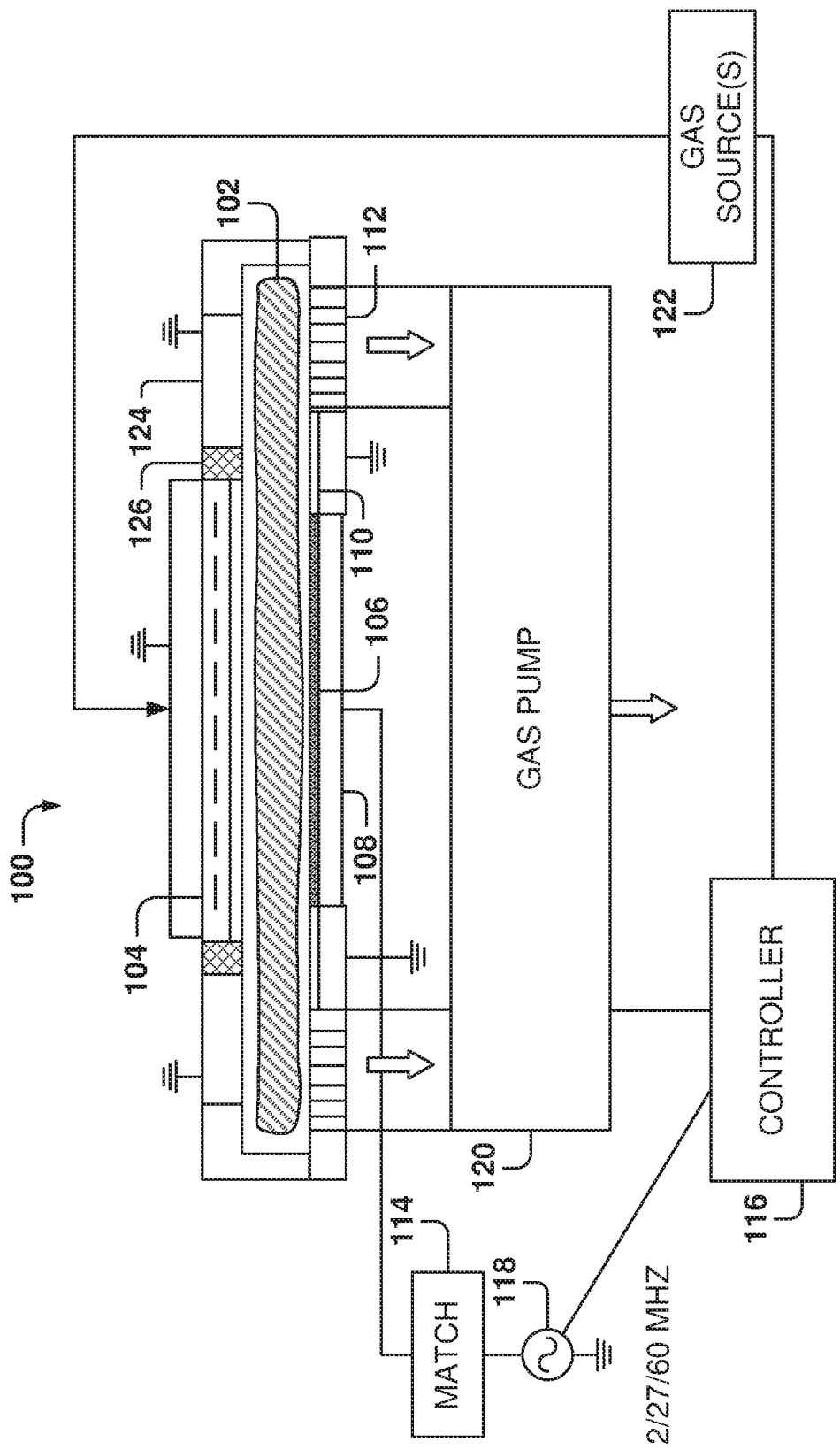
FIG. 1 is an etching chamber, according to some example embodiments.

FIG. 1 shows an etching chamber 100, according to one embodiment. Exciting an electric field between two electrodes is one of the methods to obtain radiofrequency (RF) gas discharge in an etching chamber. When an oscillating voltage is applied between the electrodes, the discharge obtained is referred to as a Capacitive Coupled Plasma (CCP) discharge.

Plasma 102 may be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from chamber walls to strike the wafer surface with enough energy to remove material from the wafer surface. This is known as ion bombardment or ion sputtering. Some industrial plasmas, however, do not produce ions with enough energy to efficiently etch a surface by purely physical means.

A controller 116 manages the operation of the chamber 100 by controlling the different elements in the chamber, such as RF generator 118, gas sources 122, and gas pump 120. In one embodiment, fluorocarbon gases, such as $CF_4$ and C—$C_4F_8$, are used in a dielectric etch process for their anisotropic and selective etching capabilities, but the principles described herein can be applied to other plasma-creating gases. The fluorocarbon gases are readily dissociated into chemically reactive by-products that include smaller molecular and atomic radicals. These chemically reactive by-products etch away the dielectric material, which in one embodiment can be $SiO_2$ or SiOCH for low-k devices.

The chamber 100 illustrates a processing chamber with a top electrode 104 and a bottom electrode 108. The top electrode 104 may be grounded or coupled to an RF generator (not shown), and the bottom electrode 108 is coupled to RF generator 118 via matching network 114. RF generator 118 provides RF power in one, two, or three different RF frequencies. According to the desired configuration of the chamber 100 for a particular operation, at least one of the three RF frequencies may be turned on or off. In the embodiment shown in FIG. 1, RF generator 118 provides 2 MHz, 27 MHz, and 60 MHz frequencies, but other frequencies are also possible.

The chamber 100 includes a gas showerhead on the top electrode 104 to input gas into the chamber 100 provided by gas source(s) 122, and a perforated confinement ring 112 that allows the gas to be pumped out of the chamber 100 by gas pump 120. In some example embodiments, the gas pump 120 is a turbomolecular pump, but other type of gas pumps may be utilized.

When substrate 106 is present in the chamber 100, silicon focus ring 110 is situated next to the substrate 106 such that there is a uniform RF field at the bottom surface of the plasma 102 for uniform etching on the surface of the substrate 106. The embodiment of FIG. 1 shows a triode reactor configuration where the top electrode 104 is surrounded by a symmetric RF ground electrode 124. Insulator 126 is a dielectric that isolates ground electrode 124 from top electrode 104.

Each frequency may be selected for a specific purpose in the wafer manufacturing process. In the example of FIG. 1, with RF powers provided at 2 MHz, 27 MHz. and 60 MHz, the 2 MHz RF power provides ion energy control, and the 27 MHz and 60 MHz power provide control of the plasma density and the dissociation patterns of the chemistry. This configuration, where each RF power may be turned on or off, enables certain processes that use ultra-low ion energy on the substrates or wafers, and certain processes (e.g., soft etch for low-k materials) where the ion energy has to be low (under 100 or 200 eV).

In another embodiment, a 60 MHz RF power is used on the top electrode 104 to get ultra-low energies and very high density. This configuration allows chamber cleaning with high density plasma when the substrate is not in the chamber 100, while minimizing sputtering on the electro static chuck (ESC) surface. The ESC surface is exposed when the substrate is not present, and any ion energy on the surface should be avoided, which is why the bottom 2 MHz and 27 MHz power supplies may be off during cleaning.

FIG. 2-10 illustrate a sequence of operations for etching a substrate in a semiconductor processing apparatus, according to some example embodiments. This sequence of operations illustrates how to add an etch-stop layer to provide additional protection from etching operations, allowing transfer of the pattern lower down into the underlying layers, further than by using EUV PR alone.

Figure 2:
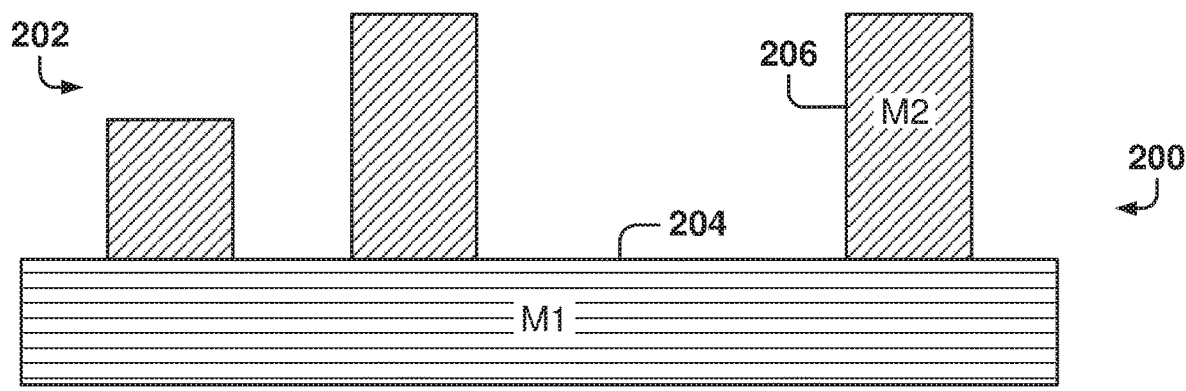
FIGS. 2-10 illustrate a sequence of operations for etching a substrate in a semiconductor processing apparatus, according to some example embodiments.

FIG. 2 illustrates operation 202, where a PR material (M2 206), is patterned onto a base material (M1 204) resulting in structure 200. In some example embodiments, the M1 204 material is a silicon oxide or a silicon nitride ($Si_xN_y$) type of material, but other materials may be used. In some embodiments, the aspect ratio for M1 204 is about 2:1, plus or minus 10%, but other aspect ratios may be used. The aspect ratio defines the relationship between the different dimensions (in this case, height of a feature against the width of the feature).

M2 206 may be a carbon-based material with some embedded dopers. EUV, also referred to as EUVL, is a lithography technology that employs an extreme ultraviolet wavelength (e.g., 13.5 nm). In some implementations, the EUV tool is a laser-driven tin (Sn) plasma light source, where reflective optics comprise multilayer mirrors, contained within a hydrogen gas ambient.

The resulting structure 200 has some dense areas (e.g., left side above M1 204) and some isolated areas (e.g., center area above M1 204). The goal of the etching process is to transfer a pattern onto M1 204 by etching down the areas of M1 204 not covered by M2 206. In some cases, EUV is used in the process, but EUV PRs are susceptible to damage because they tend to lack stability for withstanding strong etches.

With the structure 200, to pattern M1 204 with PR M2 206, it is possible to etch into M1 204, but not very deeply. Some applications require deeper etches that may etch into more than one layer, and PR M2 206 is not adequate for this applications as M2 206 may wear off and stop protecting M1 204.

The operations described below with reference to FIGS. 3-10 show how to add protection to M2 206 to allow for deeper etching into M1 204. This protection includes adding a stop-etch layer above M2 206 to allow deeper etching without completely wearing off M2 206. The stop-etch layer is a layer of material placed above the PR M2 206 that protects M2 206 during etching. Although the term "stop" is used, a person skilled in the art would appreciate that the stop-etch layer may not completely avoid some of the etching on M2 206, but the stop-etch layer provides enough protection to M2 206 to avoid completely wearing off M2 206 during deep etching. That is, the stop-etch layer provides, at least, enough protection for M2 206 to avoid etching M1 204 material under PR M2 206.

One approach might be simply to add the stop-etch layer above M2 206, but that would also mean placing the stop-etch layer above uncovered areas of M1 204, which would not be effective. The goal is to place the stop-etch layer above M2 206 without adding the stop-etch layer directly on top of M1 204.

Figure 3:
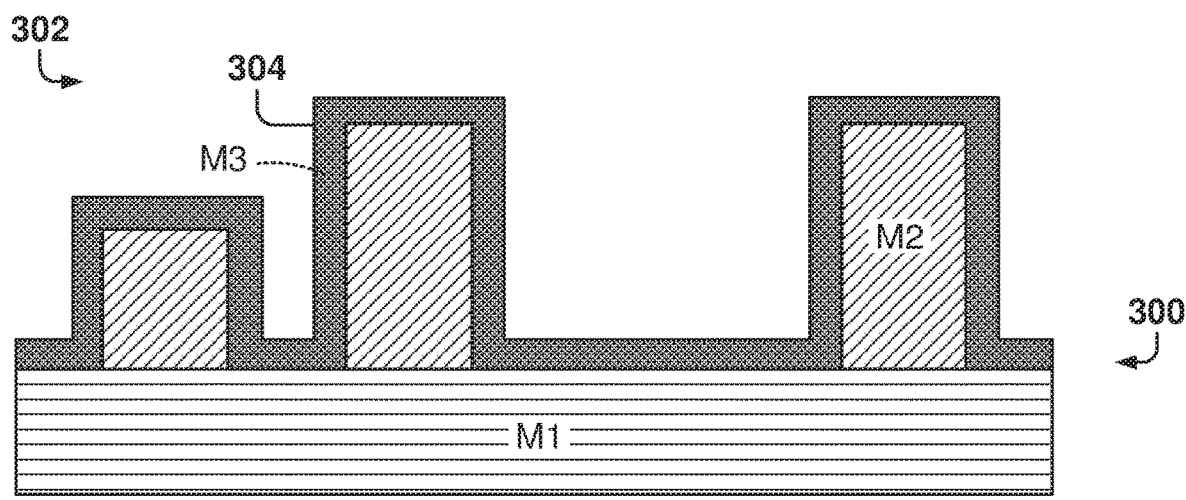

FIG. 3 illustrates operation 302 where a material M3 304 is deposited to conformally cap structure 200 with material M3 304, resulting in structure 300. When structure 200 is conformally capped with M3 304, the angles and proportions are preserved; that is, M3 forms a uniform layer above both M1 204 and M2 206.

The purpose of M3 304 is to provide a surface for the etch-stop layer to grow onto. In some example embodiments, M3 304 is an oxide, such as an atomic layer deposition (ALD) oxide. In some example embodiments, M3 304 is silicon dioxide $SiO_2$ or aluminum oxide $Al_2O_3$, but other materials may also be used.

In some example embodiments, operation 302, for placing M3 304, is performed with a low-damage plasma enhanced atomic layer deposition (PEALD). ALD is a vapor phase thin film deposition technique, which is typically carried out in a heated reactor maintained at a sub-atmospheric pressure. Substrates to be coated with an ALD film are placed in the reactor and allowed to equilibrate with the reactor temperature before the ALD process is started.

PEALD is an energy-enhanced ALD method where the surface of the substrate is exposed to the species generated by a plasma during the reactant step. Typical plasmas used during PEALD are those generated in $O_2$, $N_2$, and $H_2$ reactant gases or combinations thereof. Such plasmas can replace ligand-exchange reactions typical of water $H_2O$ or ammonia $NH_3$, and they can be employed to deposit metal oxides, metal nitrides, and metal films.

Figure 4:
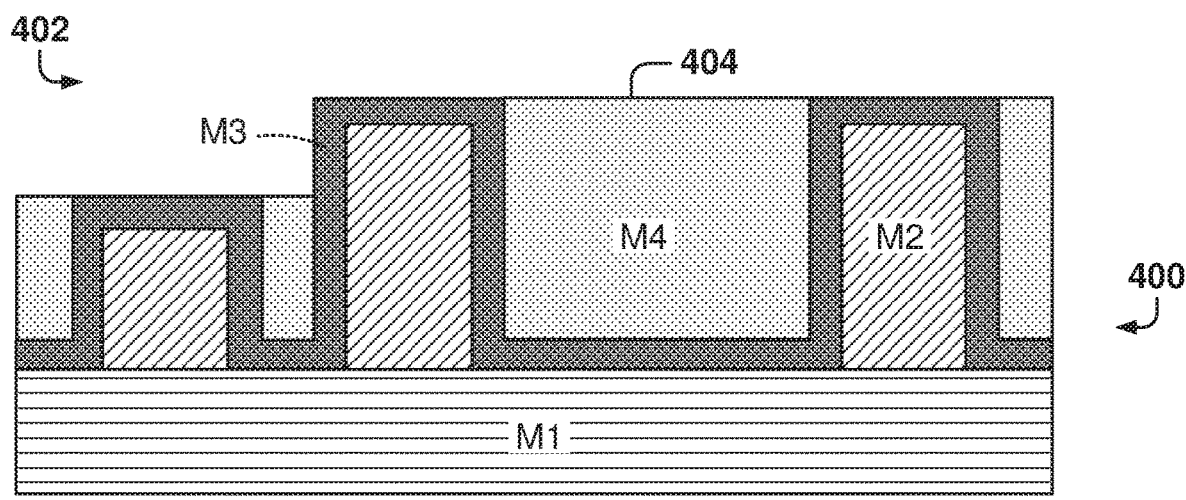

FIG. 4 illustrates operation 402 where open areas are filled with material M4 404, resulting in structure 400. In some example embodiments, M4 404, also referred to herein as filling material, is amorphous carbon, but other materials are also possible. After adding M4 404, the top of the features of M3 304 are exposed, while the other surfaces of the features are covered by M4 404.

M4 404 acts as a sacrificial material, as discussed in more detail below, to allow the stop-etch layer to grow on the top surfaces of M3 304 but not on other surfaces. In some example embodiments, operation 402 is performed in an etching environment, where hydrogen is added in the process, and along with depositing, the process also etches the material (e.g., both etching and depositing are being performed). This way, it is possible to gap fill the open areas. In the tight spaces, etching is only performed at the top but not at the bottom, so it is possible to gap fill.

The reason that M4 404 is used is that this carbon-based filler allows to selectively grow the stop-etch layer on the areas where M4 404 is not present. That is, the stop-etch layer grows on areas without M4 404 exposed and will not grow on areas where M4 404 is exposed. This way, it is possible to expose M3 304 to the stop-etch layer.

Figure 5:
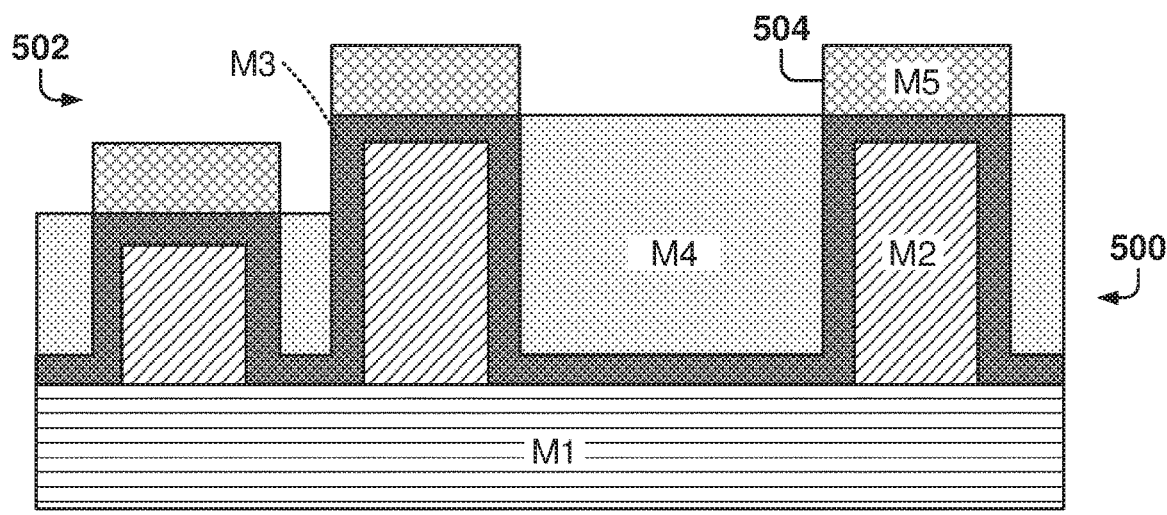

FIG. 5 illustrates operation 502 where the stop-etch layer (material M5 504) is grown above exposed M3 304, resulting in structure 500. In some example embodiments, operation 502 is an ALD process to deposit M5 504 selectively on M3 304. In some example embodiments, the ALD includes alternating a first precursor with a second precursor, for a layered growth approach.

In some example embodiments, M5 504 is a metal oxide ($MO_x$) (e.g., zirconium oxide $ZrO_x$, aluminum oxide $AlO_x$, hafnium oxide $HfO_x$) that will not grow on M4 404 because of the carbon presence (e.g., M4 404 may be $CH_x$ terminated). For example, M5 504 may be aluminum oxide. However, M5 504 will grow on M3 304, which may be a $SiO_x$ surface OH terminated.

Figure 6:
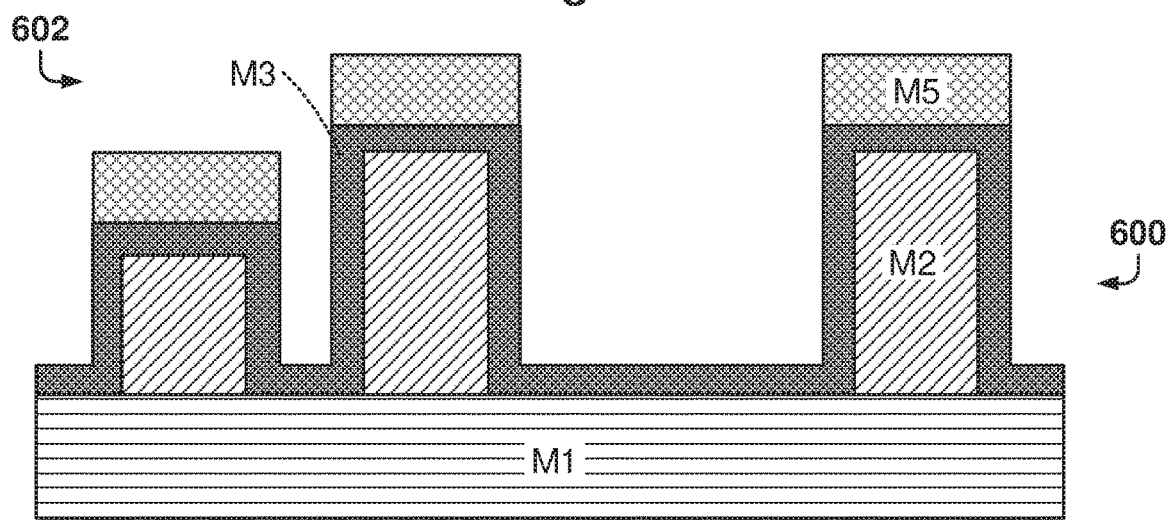

FIG. 6 illustrates operation 602 where M4 404 is removed, resulting in structure 600. As described above, the purpose of gap filling with M4 404 is to allow the selected growth of M5 504. After the stop-etch layer M5 504 has been added, M4 404 may be removed.

In some example embodiments, M4 404 may be removed by ashing, which is a straightforward operation because carbon is easy to remove. For example, a hydrogen plasma may be utilized to remove M4 404.

Plasma ashing is a process for removing material from a substrate. Using a plasma source, a single-atom substance, known as a reactive species, is generated. Oxygen or fluorine are common reactive species. The reactive species combine with the material to be removed to form ash, which is removed with a vacuum pump.

Figure 7:
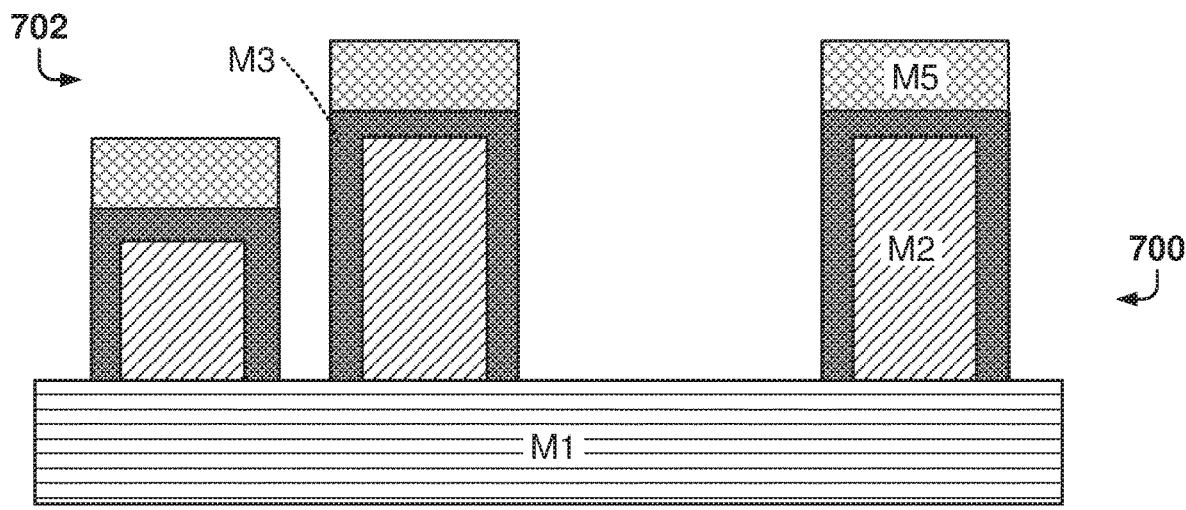

FIG. 7 illustrates operation 702 where M3 304 is removed on the exposed surfaces, resulting in structure 700. After M4 404 has been removed, the etching process may continue to transfer the pattern defined by M2 206 into M1 204. In some example embodiments, operation 602 is performed via etching to remove M3 304.

At this point, part of the top surface of M1 204 is uncovered, while the pattern defined by M2 206 has extra protection against etching because M2 206 is covered with M5 504. Deep etching of M1 204 may now be performed, as described below.

Figure 8:
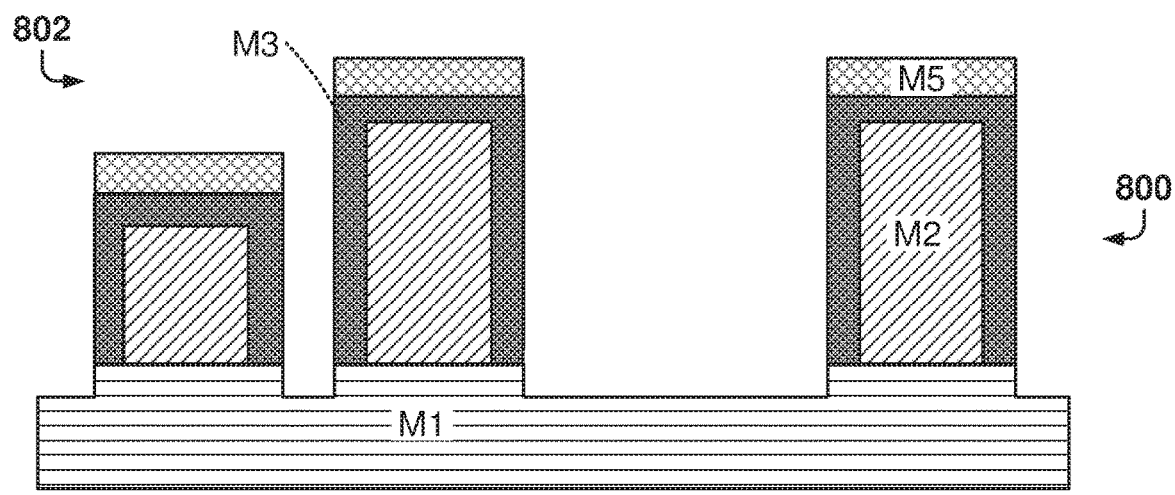

FIG. 8 illustrates operation 802 for etching unexposed surfaces of M1 204, resulting in structure 800. Etching is performed to transfer the pattern into M1 204. As M1 204 is being etched, M5 504 is also being removed, until M5 504 is completely removed, but the etching may continue because M2 206 is still present.

Structure 800 shows the gradual etching into M1 204 and the wearing off of M5 504. Because M5 504 is present, it is possible to go deeper into M1 204.

Figure 9:
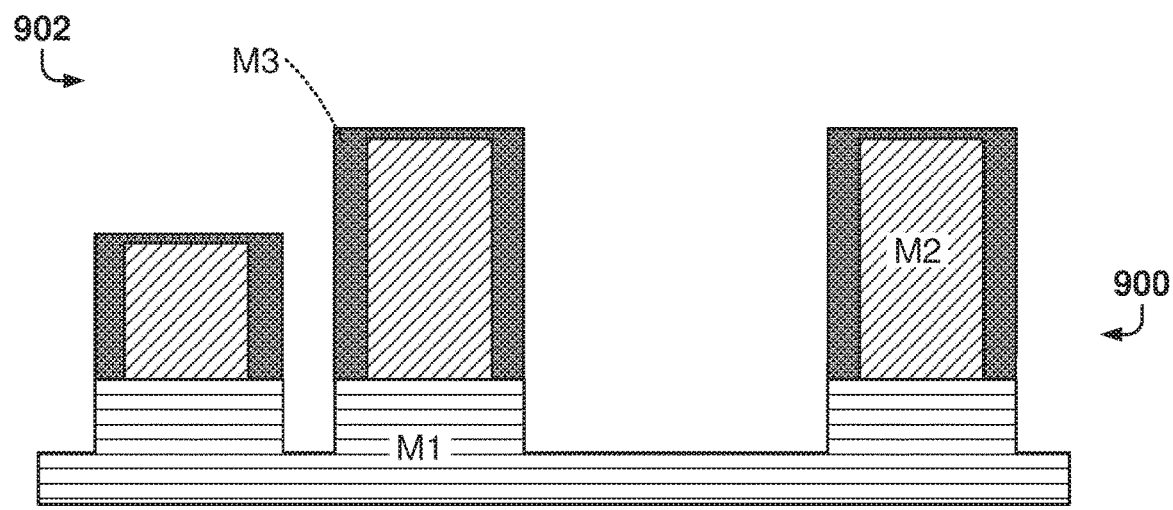

FIG. 9 illustrates operation 902 where etching continues into M1 204 while etching away M3 304, resulting in structure 900. At the end of operation 902, M3 304 has been etched away (not shown), or at least most of it, but M2 206 still continues providing protection to M1 204 to transfer the pattern and go deeper into M1 204.

Figure 10:
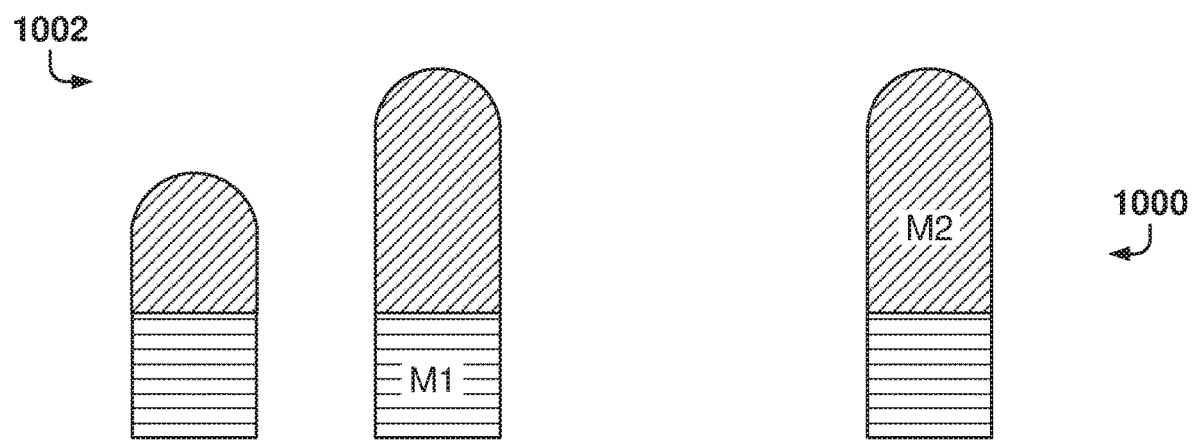

FIG. 10 illustrates operation 1002 where M5 504 and M3 304 have been removed and some of M2 206 has also been etched away, resulting in structure 1000. At the end of operation 1002, the desired sections of M1 204 have been etched away, while some of M2 206 still remains, resulting in the desired CD being maintained.

As illustrated in structure 1000, some of the edges of M2 206 have been rounded off due to etching. A person skilled in the art would readily appreciate that FIGS. 2-10 show an ideal representation of the materials, including perfect straight lines. However, during the different operations, depositions and etching may result in slight variations in the materials (e.g., thickness and uneven corners).

In summary, by gap filling with M4 404, it is possible to selectively grow M5 504 above M2 206. M3 304 allows M5 504 to grow on a consistent surface.

Figure 11:
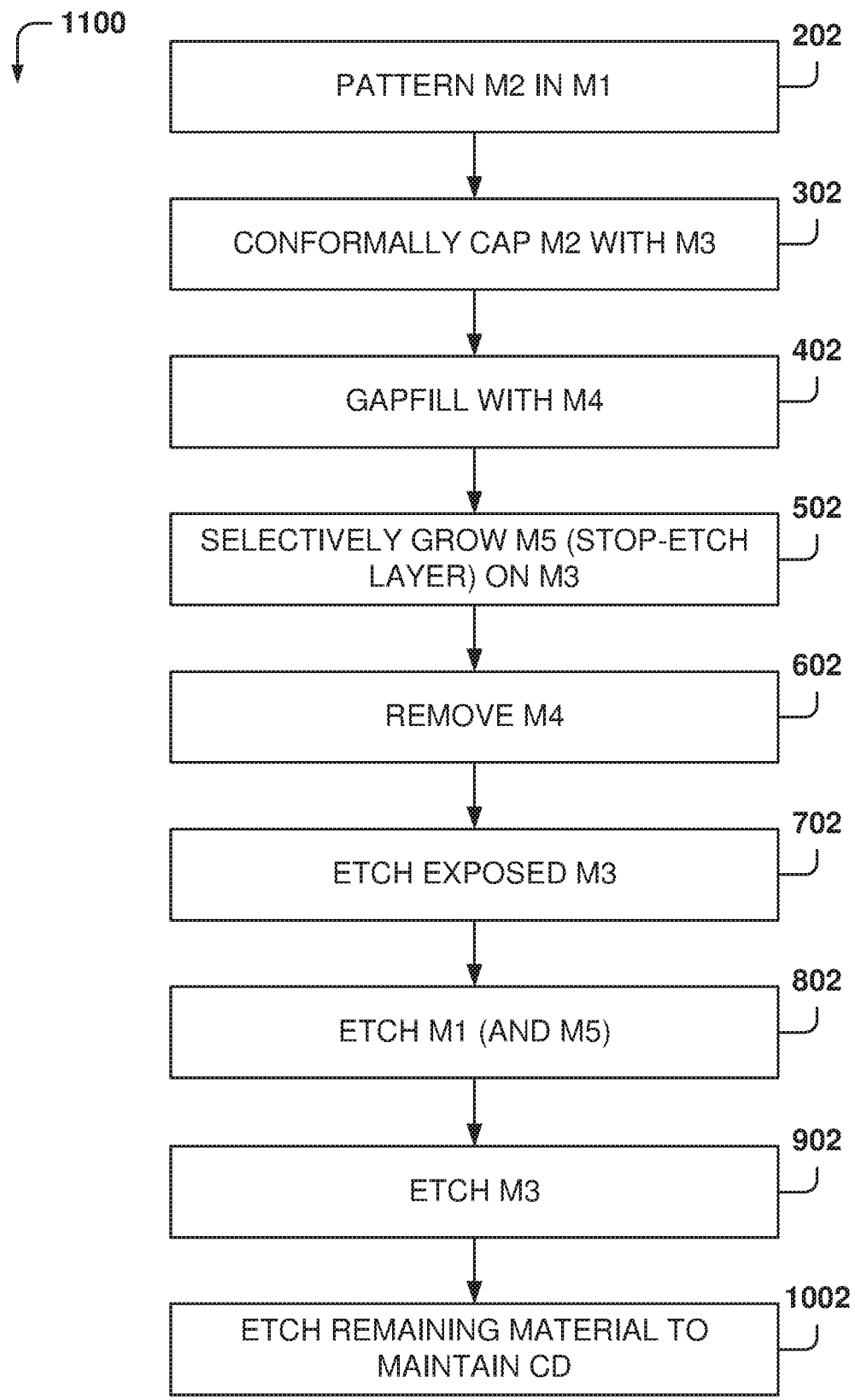
FIG. 11 is a flowchart of a method for processing a substrate in a semiconductor processing apparatus, according to some example embodiments.

FIG. 11 is a flowchart of a method for processing a substrate in a semiconductor processing apparatus, according to some example embodiments. While the various operations in this flowchart are presented and described sequentially, one of ordinary skill will appreciate that some or all of the operations may be executed in a different order, be combined or omitted, or be executed in parallel. FIG. 11 summarizes the process illustrated in FIGS. 2-10.

At operation 202, a pattern M2 206 is created above material M1 204. In some example embodiments. EUV is utilized to create the pattern, but other lithography methods may also be utilized.

From operation 202, the method flows to operation 302 where M2 206 is conformally capped with M3 304. At operation 402, gaps are filled with material M4 404, while preserving the top surfaces of M3 304 that are above the pattern defined by M2 206.

From operation 402, the method flows to operation 502. Once M4 404 has been added, it is possible to selectively grow M5 504 on top of M3 304 but not on top of M4 404.

From operation 502, the method flows to operation 602. Once M4 404 has served its purpose, enabling to selectively grow M5 504, M4 404 is removed.

From operation 602, the method flows to operation 702, where M3 304 sections that are not protected by M5 504 are etched away.

From operation 702, the method flows to operation 802, where etching of the base layer of M1 202 begins. As M1 202 is being etched away, the top surface of M5 504 is also being etched away, but still provides protection to the pattern defined by M2 206.

From operation 802, the method flows to operation 902, where etching on M1 continues while also etching away M3 304.

From operation 902, the method flows to operation 1002. After M3 304 has been etched away, the etching on M1 204 continues, which means that the pattern of M2 206 is also gradually being etched away. However, M2 206 is not completely etched away, thereby guaranteeing that the pattern is transferred into M1 204.

Figure 12:
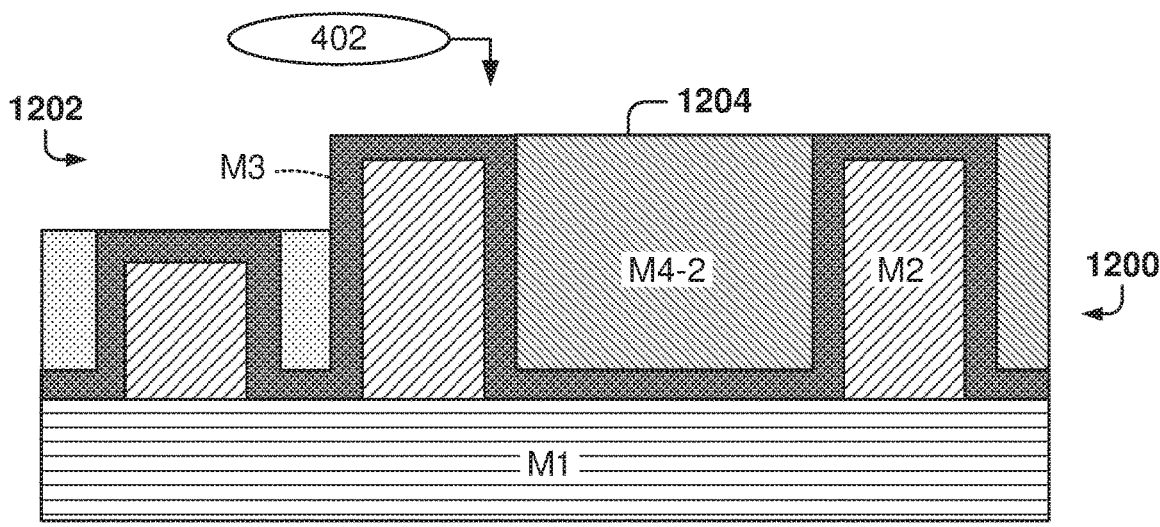
FIGS. 12-14 illustrate a second sequence of operations for etching the substrate in a semiconductor processing apparatus, according to some example embodiments.
Figure 13:
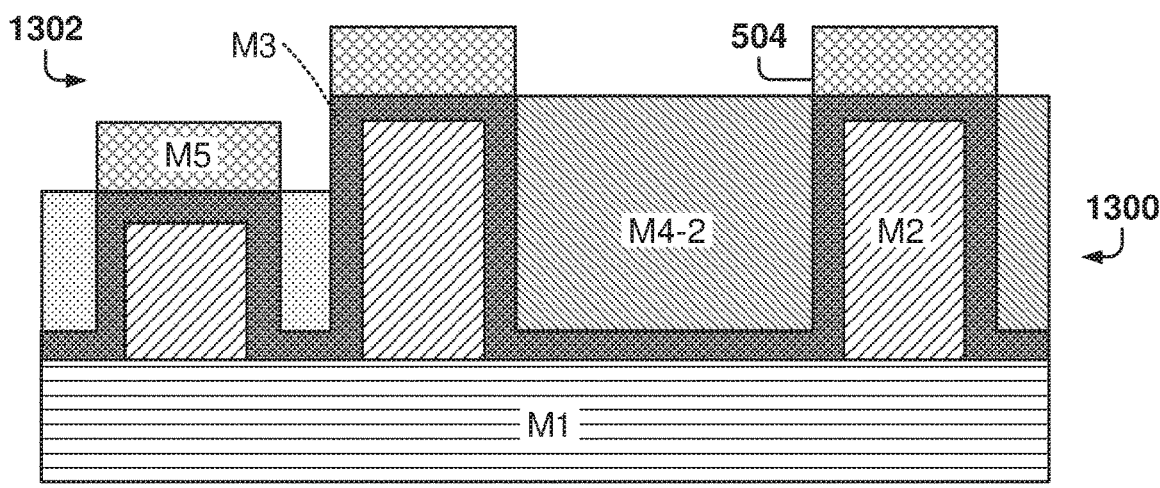
Figure 14:
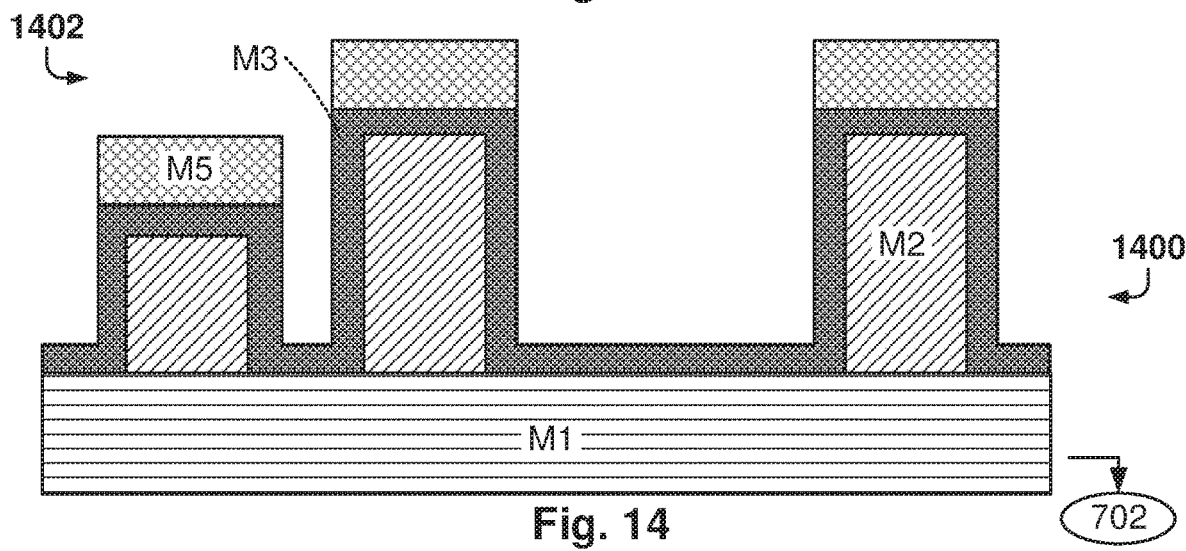

FIGS. 12-14 illustrate a second sequence of operations for etching the substrate in a semiconductor processing apparatus, according to some example embodiments. The second sequence also enables the use of EUV PR to transfer the pattern lower into the under layers, which would have not been possible with the EUV PR alone.

The second sequence also includes operations 202, 302, and 402, as illustrated above with reference to FIGS. 2-4. However, from operation 402, the second sequence flows from operation 402 to operation 1202 of FIG. 12.

FIG. 12 illustrates operation 1202 where M4 404 is converted to material M4-2 1204, resulting in structure 1200. In some example embodiments, M4 402 is a CHx surface that is converted to a CFx surface M4-2 1204. The CFx surface may offer more non-wetting surface for the desired chemistries than the CHx surface, thereby improving the selectivity of depositing M5 504. In some example embodiments, M4 402 is converted to M4-2 1204 by fluorinating M4 402.

The fluorination of the carbon film (CHx) may be performed by a capacitively coupled plasma or a remote plasma assisted process that enable fluorinating the carbon surface.

FIG. 13 illustrates operation 1302 where the stop-etch layer (material M5 504) is grown above exposed M3 304, resulting in structure 1300. As in operation 502, the ALD process is utilized to deposit M5 504 selectively on M3 304. The metal oxide ($MO_x$) will not grow onto the CFx terminated surface (M4-2 1204) enabling selective growth on the $SiO_x$ surface (M3 304).

FIG. 14 illustrates operation 1402 where M4-2 1204 is removed, resulting in structure 1400, which is similar to structure 600 of FIG. 6. In some example embodiments, M4-2 1204 may be removed by ashing, which is a simple operation because carbon is easy to remove. For example, a hydrogen plasma may be utilized to remove M4-2 1204.

From operation 1402, the method flows to operation 702 of FIG. 7, and the remainder of the operations in the second sequence are the same as the operations following operation 702 in the first sequence.

Figure 15:
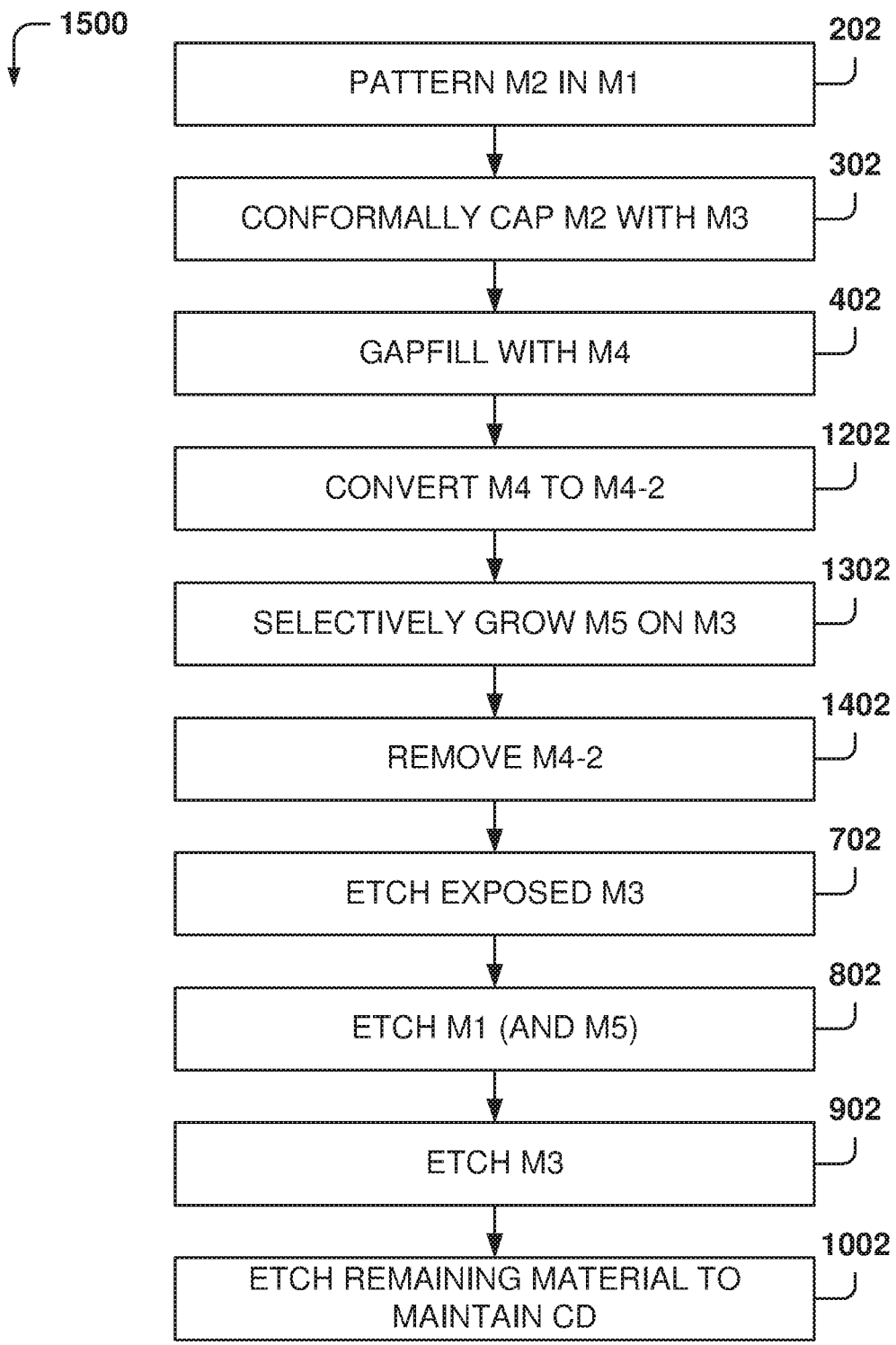
FIG. 15 is a flowchart of a second method for processing a substrate in a semiconductor processing apparatus, according to some example embodiments.

FIG. 15 is a flowchart of a second method for processing a substrate in a semiconductor processing apparatus, according to some example embodiments. While the various operations in this flowchart are presented and described sequentially, one of ordinary skill will appreciate that some or all of the operations may be executed in a different order, be combined or omitted, or be executed in parallel.

Operations 202, 302, and 402 are the same as described above with reference to FIG. 11. At operation 1202, material M4 404 is converted (e.g., by fluorinating) to a different type of material M4-2 1204.

From operation 1202, the method flows to operation 1302, where material M5 504 is selectively grown on M3 304, but not on M4-2 1204.

From operation 1302, the method flows to operation 1402, where material M4-2 1204 is removed, such as by ashing or other type of etching process.

From operation 1402, the method flows to operation 702, and the reminder of the steps are the same as described above with reference to FIG. 11.

FIGS. 16-20 illustrate a third sequence for etching a substrate in a semiconductor processing apparatus, according to some example embodiments. The third sequence is a hybrid approach, where a new material M6 1604 is added on top of M3 304, before gap filling with M4 404, to improve selectivity when growing M5 504.

Figure 16:
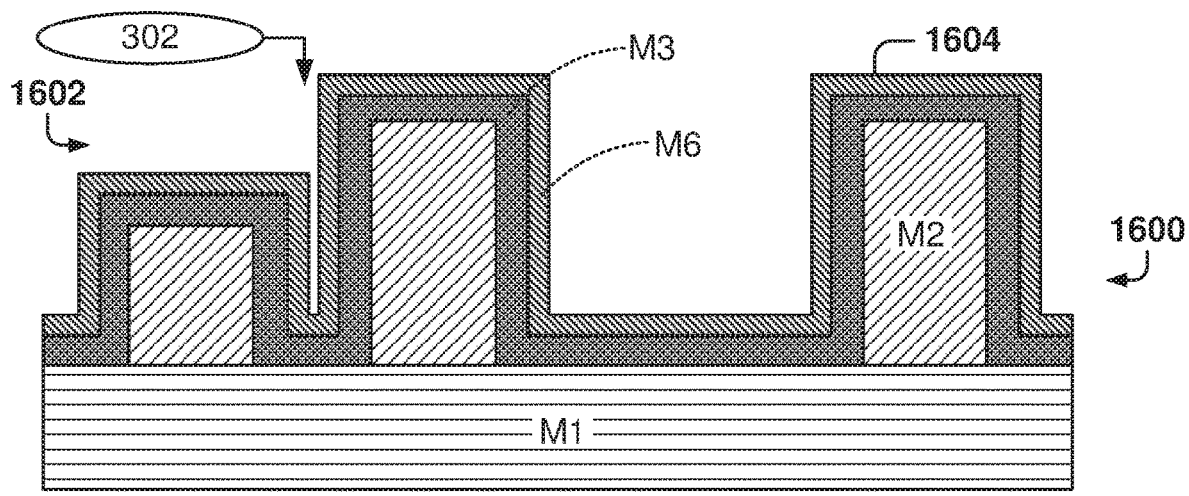
FIGS. 16-20 illustrate a third sequence for etching a substrate in a semiconductor processing apparatus, according to some example embodiments.

The third sequence includes operations 202 and 302, as described above. From operation 302, the third sequence continues in operation 1602. FIG. 16 illustrates operation 1602 where M3 304 is capped with a conformal layer of material M6 1604, resulting in structure 1600.

In some example embodiments. M6 1604 is a fluorocarbon $CF_x$. In some example embodiments, operation 1602, for placing M6 1604, is performed with a low-damage plasma enhanced atomic layer deposition (PEALD).

Figure 17:
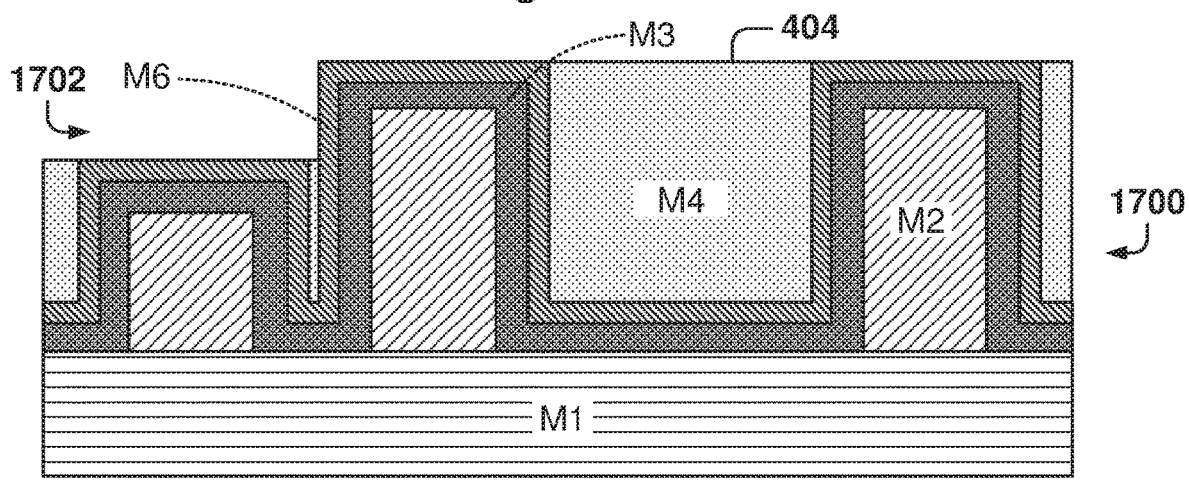

FIG. 17 illustrates operation 1702 where open areas are filled with material M4 404, resulting in structure 1700. Operation 1702 is similar to operation 402 described above with reference to FIG. 4, except for the presence of M6 1604 on the top surface.

Figure 18:
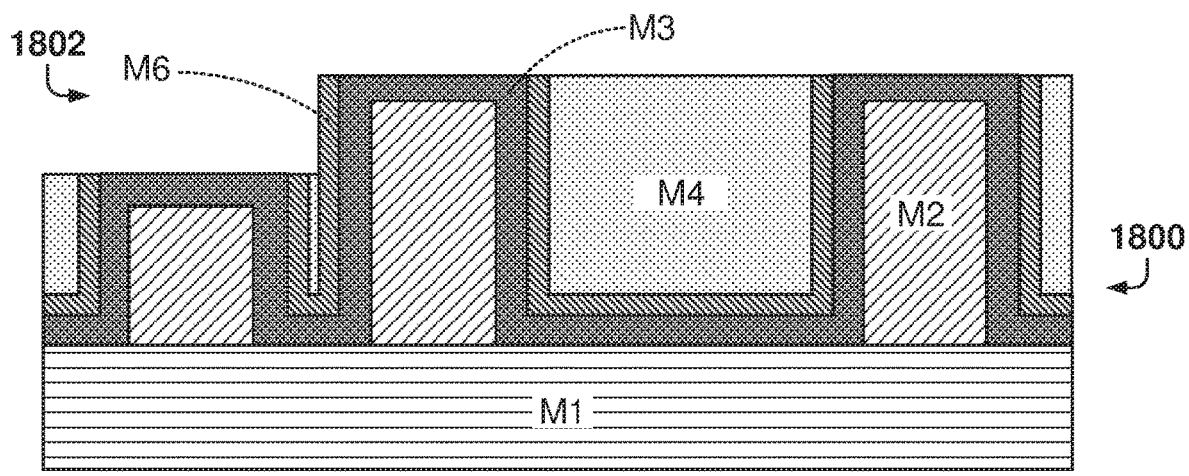

FIG. 18 illustrates operation 1802 where top surfaces of M6 1604, associated with the pattern to be transferred, are removed to expose M3 304 before growing M5 504. The result is structure 1800. In some example embodiments, the top surfaces of M6 1604 are removed with a light etch operation to expose the oxide surface, but other removal operations are possible.

Figure 19:
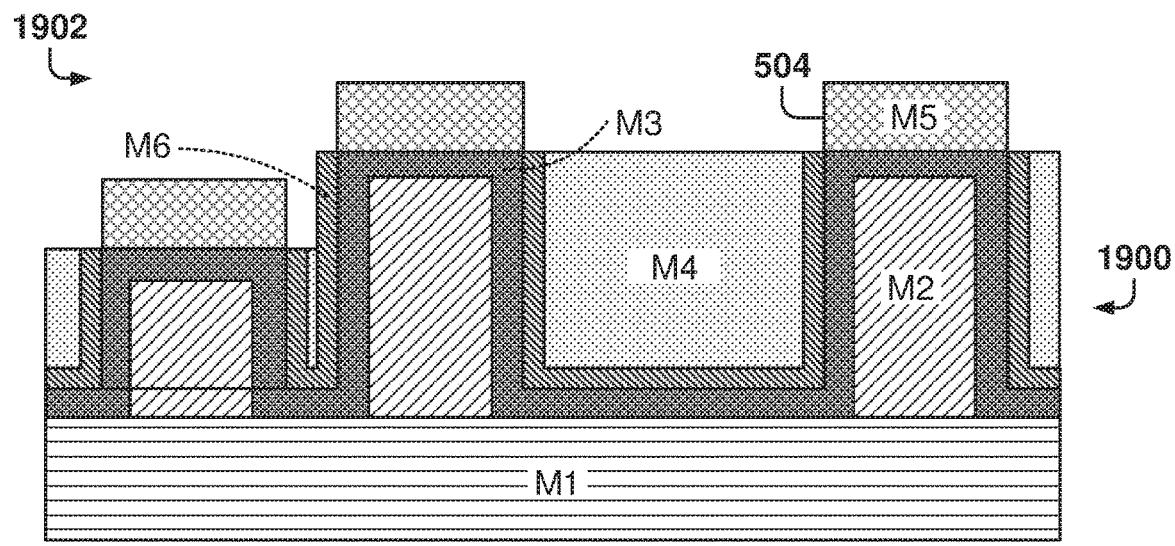

FIG. 19 illustrates operation 1902 where the stop-etch layer (material M5 504) is grown above exposed M3 304, resulting in structure 1900. The presence of M6 1604 improves selectivity when growing M5 504 because M6 1604 provides a separation between M3 304 and M4 4041; therefore, the selectivity is improved. The metal oxide may be deposited via by MOCVD (Metal Organic CVD), and the metal oxide will not grow onto the CFx or CHx surfaces. This will enable growth of MOx selectivity on SiOx surface, which may be —OH terminated.

Figure 20:
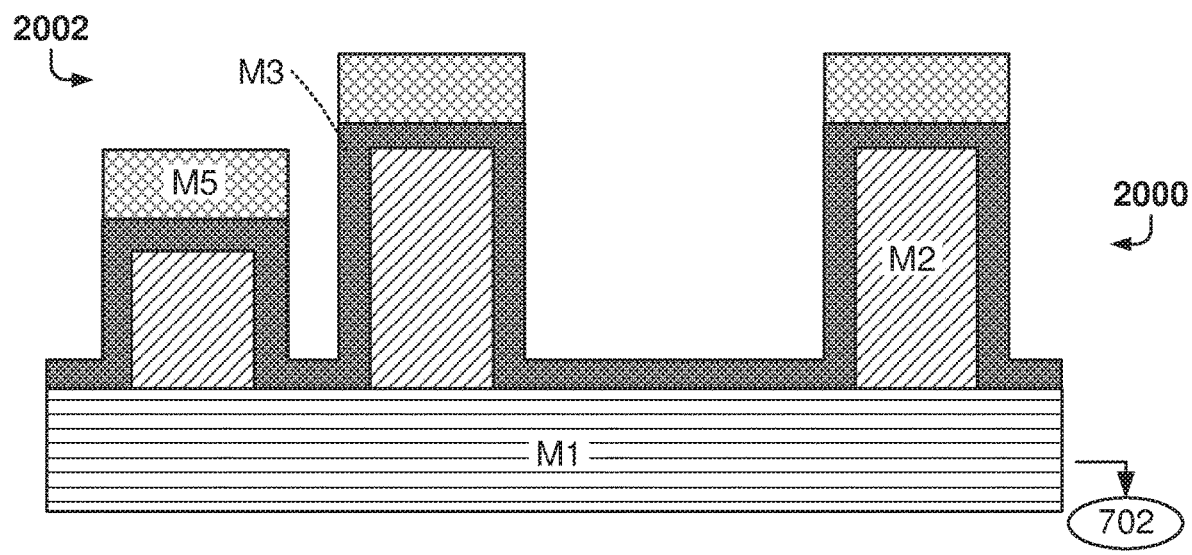

FIG. 20 illustrates operation 2002 where M4 404 and M6 1604 are removed, resulting in structure 2000. As described above, the purpose of gap filling with M4 404 is to allow the selected growth of M5 504. After the stop-etch layer M5 504 has been added, M4 404 and M6 1604 may be removed.

In some example embodiments, M4 404 and M6 1604 may be removed by ashing, which is a simple operation because carbon is easy to remove. For example, a hydrogen plasma may be utilized to remove M4 404.

After operation 2002, the third sequence continues at operation 702, as illustrated in FIG. 7, and the remainder of the operations are the same as in the first sequence described in FIG. 11.

Figure 21:
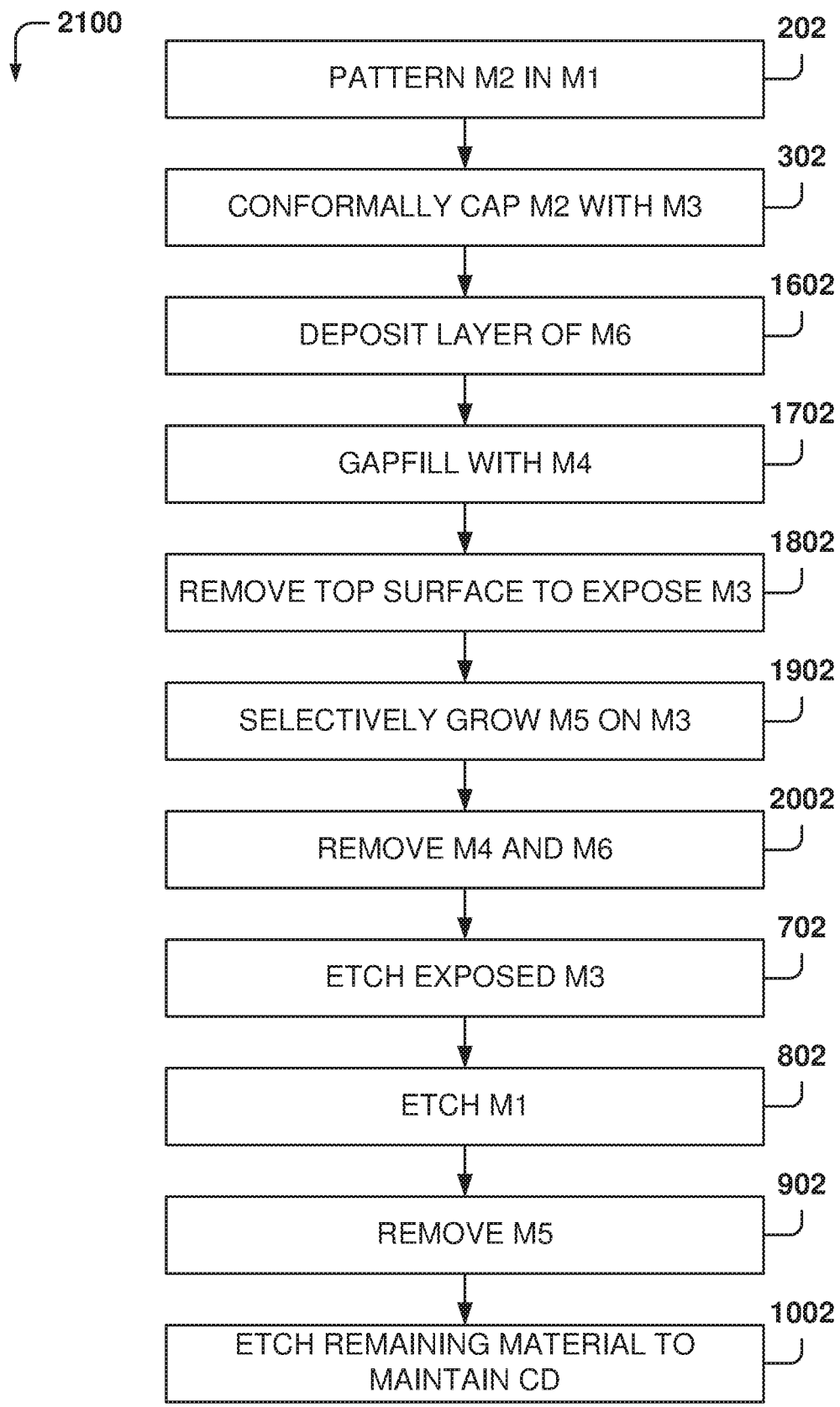
FIG. 21 is a flowchart of a third method for processing a substrate in a semiconductor processing apparatus, according to some example embodiments.

FIG. 21 is a flowchart of a third method for processing a substrate in a semiconductor processing apparatus, according to some example embodiments. While the various operations in this flowchart are presented and described sequentially, one of ordinary skill will appreciate that some or all of the operations may be executed in a different order, be combined or omitted, or be executed in parallel.

Operations 202 and 302 are the same as described above with reference to FIG. 11. At operation 1602, a layer of material M6 1604 is conformally grown above M3 304.

From operation 1602, the method flows to operation 1702, where open areas are gap filled with M4 404. From operation 1702, the method flows to operation 1802, where the top surfaces of M4 404 and M6 1604 are removed to expose M3 304.

From operation 1802, the method flows to operation 1902, where M5 504 is selectively grown on M3 304. From operation 1902, the method flows to operation 2002, where M4 404 and M6 1604 are removed.

From operation 2002, the method flows to operation 702, as described above with reference to FIG. 7, and the remainder of the operations are the same as described above with reference to FIG. 11.

Figure 22:
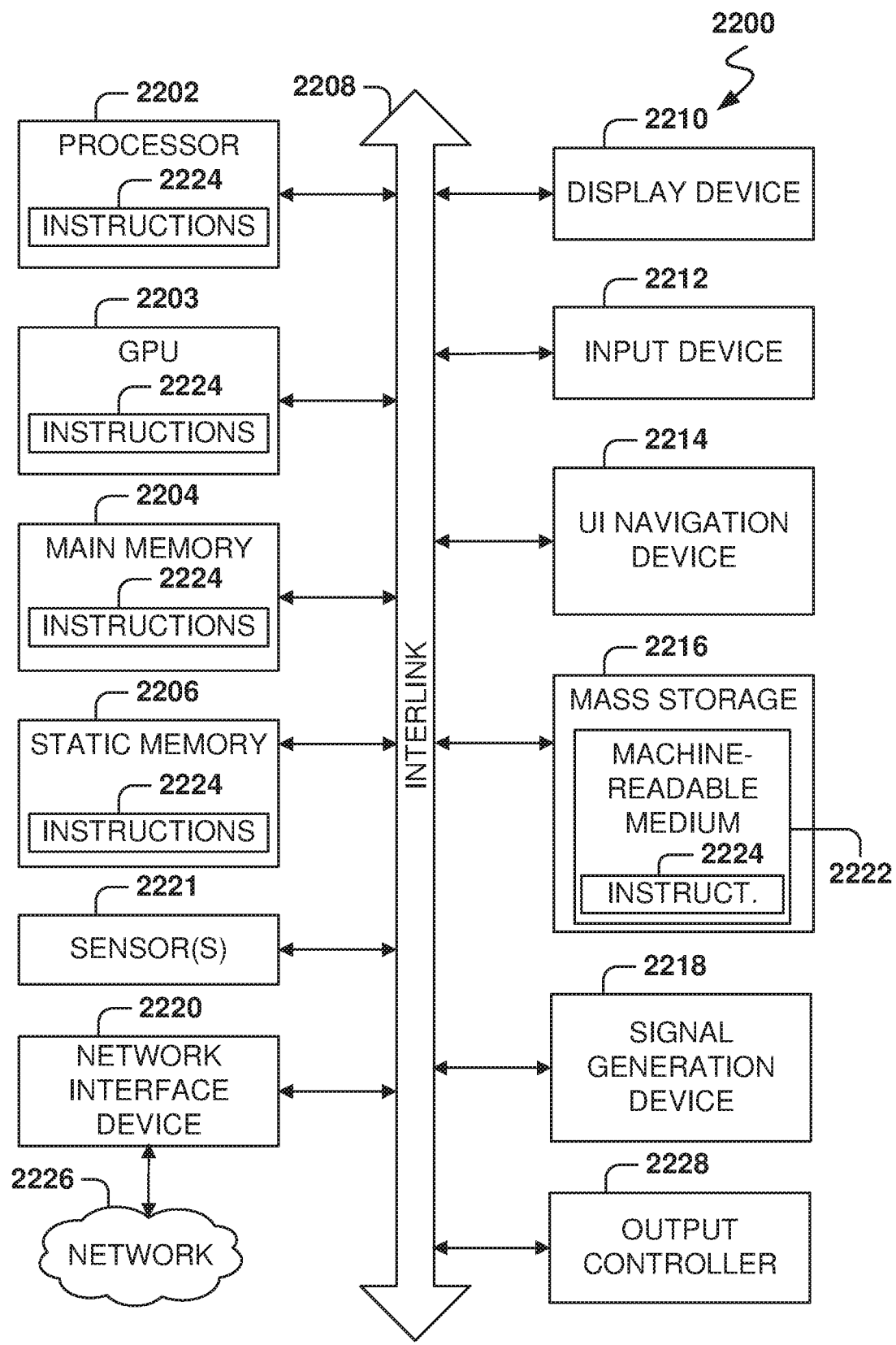
FIG. 22 is a block diagram illustrating an example of a machine upon which one or more example embodiments may be implemented, or by which one or more example embodiments may be controlled.

FIG. 22 is a block diagram illustrating an example of a machine 2200 upon or by which one or more example process embodiments described herein may be implemented or controlled. In alternative embodiments, the machine 2200 may operate as a standalone device or may be connected (e.g., networked) to other machines. In a networked deployment, the machine 2200 may operate in the capacity of a server machine, a client machine, or both in server-client network environments. In an example, the machine 2200 may act as a peer machine in a peer-to-peer (P2P) (or other distributed) network environment. Further, while only a single machine 2200 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 2200 may include a hardware processor 2202 (e.g., a central processing unit (CPU), a hardware processor core, or any combination thereof), a graphics processing unit (GPU) 2203, a main memory 2204, and a static memory 2206, some or all of which may communicate with each other via an interlink (e.g., bus) 2208. The machine 2200 may further include a display device 2210, an alphanumeric input device 2212 (e.g., a keyboard), and a user interface (UI) navigation device 2214 (e.g., a mouse). In an example, the display device 2210, alphanumeric input device 2212, and UI navigation device 2214 may be a touch screen display. The machine 2200 may additionally include a mass storage device (e.g., drive unit) 2216, a signal generation device 2218 (e.g., a speaker), a network interface device 2220, and one or more sensors 2221, such as a Global Positioning System (GPS) sensor, compass, accelerometer, or other sensor. The machine 2200 may include an output controller 2228, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 2216 may include a machine-readable medium 2222 on which is stored one or more sets of data structures or instructions 2224 (e.g., software) embodying or utilized by any one or more of the techniques or functions described herein. The instructions 2224 may also reside, completely or at least partially, within the main memory 2204, within the static memory 2206, within the hardware processor 2202, or within the GPU 2203 during execution thereof by the machine 2200. In an example, one or any combination of the hardware processor 2202, the GPU 2203, the main memory 2204, the static memory 2206, or the mass storage device 2216 may constitute machine-readable media.

While the machine-readable medium 2222 is illustrated as a single medium, the term "machine-readable medium" may include a single medium, or multiple media, (e.g., a centralized or distributed database, and/or associated caches and servers) configured to store the one or more instructions 2224.

The term "machine-readable medium" may include any medium that is capable of storing, encoding, or carrying instructions 2224 for execution by the machine 2200 and that cause the machine 2200 to perform any one or more of the techniques of the present disclosure, or that is capable of storing, encoding, or carrying data structures used by or associated with such instructions 2224. Non-limiting machine-readable medium examples may include solid-state memories, and optical and magnetic media. In an example, a massed machine-readable medium comprises a machine-readable medium 2222 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 2224 may further be transmitted or received over a communications network 2226 using a transmission medium via the network interface device 2220.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method comprising:
adding a photo-resist material (M2) on top of a base material (M1) of a substrate, M2 defining a pattern for etching M1 in areas where M2 is not present above M1;
conformally capping the substrate with an oxide material (M3) after adding M2;
gap filling the substrate with filling material M4 after the conformally capping;
converting filling material M4 to filling material M4-2;
selectively growing stop-etch material (M5) on exposed surfaces of M3 and not on surfaces of M4-2 after the converting;
removing M4-2 from the substrate after selectively growing M5; and
etching the substrate after removing M4-2 to transfer the pattern into M1.

2. The method as recited in claim 1, wherein etching the substrate after removing M4 further comprises:
etching exposed surfaces of M3 in the substrate; and
continue etching the substrate to transfer the pattern into M1.

3. The method as recited in claim 1, wherein M2 is a carbon-based material.

4. The method as recited in claim 1, wherein M3 is one of silicon dioxide or aluminum oxide.

5. The method as recited in claim 1, wherein M4 is a CHx surface, wherein M4-2 is a CFx surface.

6. The method as recited in claim 1, wherein converting the filling material M4 comprises:
converting M4 to M4-2 by fluorinating M4.

7. The method as recited in claim 1, wherein M5 is a metal oxide or oxynitride.

8. The method as recited in claim 1, wherein conformally capping the substrate with M3 further comprises:
performing a low-damage plasma enhanced atomic layer deposition.

9. The method as recited in claim 1, wherein gap filling the substrate with filling material M4 further comprises:
alternating depositing M4 and etching M4 to fill gaps in the substrate.

10. The method as recited in claim 1, wherein selectively growing M5 further comprises:
utilizing an atomic-layer-deposition process to deposit M5.

11. The method as recited in claim 1, wherein removing M4-2 from the substrate further comprises:
performing plasma ashing to remove M4-2.

12. The method as recited in claim 1, wherein M5 adds etching protection to enable deeper etching into M1 than when utilizing M2 without M5.

13. A semiconductor manufacturing apparatus comprising:
a processing chamber; and
a controller for controlling processing of a substrate within the processing chamber, wherein the controller causes the processing chamber to perform operations comprising:
adding a photo-resist material (M2) on top of a base material (M1) of a substrate, M2 defining a pattern for etching M in areas where M2 is not present above M1;
conformally capping the substrate with an oxide material (M3) after adding M2;
gap filling the substrate with filling material M4 after the conformally capping;
converting filling material M4 to filling material M4-2;
selectively growing stop-etch material (M5) on exposed surfaces of M3 and not on surfaces of M4-2 after the converting;
removing M4-2 from the substrate after selectively growing M5; and
etching the substrate after removing M4-2 to transfer the pattern into M1.

14. The semiconductor manufacturing apparatus as recited in claim 13, wherein etching the substrate after removing M4 further comprises:
etching exposed surfaces of M3 in the substrate; and
continue etching the substrate to transfer the pattern into M1.

15. The semiconductor manufacturing apparatus as recited in claim 13, wherein M3 is one of silicon dioxide or aluminum oxide.

16. The semiconductor manufacturing apparatus as recited in claim 13, wherein M4 is a CHx surface, wherein M4-2 is a CFx surface.

17. The semiconductor manufacturing apparatus as recited in claim 13, wherein converting the filling material M4 comprises converting M4 to M4-2 by fluorinating M4.

18. The semiconductor manufacturing apparatus as recited in claim 13, wherein M5 is a metal oxide.

19. The semiconductor manufacturing apparatus as recited in claim 13, wherein gap filling the substrate with filling material M4 further comprises:
alternating depositing M4 and etching M4 to fill gaps in the substrate.

20. The semiconductor manufacturing apparatus as recited in claim 13, wherein removing M4-2 from the substrate further comprises:
performing plasma ashing to remove M4-2.

* * * * *